United States Patent
Meijer et al.

(10) Patent No.: US 8,999,186 B2
(45) Date of Patent: *Apr. 7, 2015

(54) SELECTIVELY ETCHING OF A POLYMER MATRIX ON PET

(75) Inventors: Arjan Meijer, Reinheim (DE); Werner Stockum, Reinheim (DE); Ingo Koehler, Reinheim (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/114,401

(22) PCT Filed: Mar. 28, 2012

(86) PCT No.: PCT/EP2012/001364
§ 371 (c)(1),
(2), (4) Date: Oct. 28, 2013

(87) PCT Pub. No.: WO2012/146339
PCT Pub. Date: Nov. 1, 2012

(65) Prior Publication Data
US 2014/0054260 A1 Feb. 27, 2014

(30) Foreign Application Priority Data
Apr. 28, 2011 (EP) .................... 11003480

(51) Int. Cl.
B44C 1/22 (2006.01)
C09K 13/02 (2006.01)
B81C 1/00 (2006.01)
B82Y 10/00 (2011.01)
B82Y 40/00 (2011.01)
G03F 7/00 (2006.01)
G03F 7/20 (2006.01)
H01L 51/00 (2006.01)

(52) U.S. Cl.
CPC ............. *C09K 13/02* (2013.01); *B81C 1/00539* (2013.01); *B82Y 10/00* (2013.01); *B82Y 40/00* (2013.01); *G03F 7/0002* (2013.01); *G03F 7/2018* (2013.01); *H01L 51/0017* (2013.01); *H01L 51/0023* (2013.01)

(58) Field of Classification Search
CPC .... B82Y 10/00; C09K 13/02; H01L 51/0017; H01L 51/0023; H01L 51/444; G03F 7/0002; G03F 7/2018
USPC ............................................ 216/83; 252/79.5
See application file for complete search history.

(56) References Cited

U.S. PATENT DOCUMENTS

| | | | |
|---|---|---|---|
| 5,514,318 A * | 5/1996 | Detenon | 264/132 |
| 7,196,018 B2 | 3/2007 | Szlufcik et al. | |
| 8,540,891 B2 | 9/2013 | Kubelbeck et al. | |
| 8,809,112 B2 * | 8/2014 | Stockum et al. | 438/99 |
| 2004/0063326 A1 | 4/2004 | Szlufcik et al. | |
| 2005/0247674 A1 | 11/2005 | Kubelbeck et al. | |
| 2009/0305456 A1 * | 12/2009 | Funakoshi | 438/98 |
| 2009/0321113 A1 | 12/2009 | Allemand et al. | |
| 2010/0068889 A1 * | 3/2010 | Stockum et al. | 438/745 |
| 2010/0200539 A1 * | 8/2010 | Yun et al. | 216/13 |
| 2011/0149538 A1 * | 6/2011 | Cui et al. | 361/761 |

FOREIGN PATENT DOCUMENTS

| | | |
|---|---|---|
| EP | 1378947 A1 | 1/2004 |
| WO | 2004032218 A1 | 4/2004 |
| WO | 2009017852 A2 | 2/2009 |

OTHER PUBLICATIONS

International Search Report for PCT/EP2012/001364 dated Jun. 25, 2012.
Sun, Y. et al, "Bendable GaAs metal-semiconductor field-effect transistors formed with printed GaAs wire arrays on plastic substrates," Applied Physics Letters, 2005, vol. 87, 3 pages.

* cited by examiner

*Primary Examiner* — Shamim Ahmed
(74) *Attorney, Agent, or Firm* — Millen, White, Zelano & Branigan, P.C.

(57) ABSTRACT

The present invention relates to a method for selectively etching and patterning with high resolution of flexible polymer matrices, which may comprise Ag nano tubes.

20 Claims, No Drawings

SELECTIVELY ETCHING OF A POLYMER MATRIX ON PET

FIELD OF THE INVENTION

The present invention relates to a method for selectively etching and patterning with high resolution a polymer matrix, which comprises Ag nano tubes.

BACKGROUND OF THE INVENTION/STATE OF THE ART

Micro/nanowires with integrated ohmic contacts have been prepared from bulk wafers by metal deposition and patterning, high-temperature annealing, and anisotropic chemical etching. Now, electrical devices, formed with high-quality single-crystalline seminconductor nano- and microstructures on large area mechanically flexible plastic substrates, which are of great interest for a wide range of applications in displays, sensors, medical devices and other systems. A number of approaches have been demonstrated to transfer high-quality semiconductor materials onto plastic substrates.

Traditional photolithography methods, although they are versatile in the architectures and compositions of surface features to be formed, are costly and require specialized equipment. Beyond this, photolithography methods have difficulty patterning very large and/or non-rigid surfaces such as textiles, paper, plastics, and the like.

In laser supported etching methods the laser beam scans the entire etch pattern point for point on the substrate, which, in addition to a high degree of precision, also requires considerable adjustment effort and is very time-consuming.

But meanwhile it is possible to provide high performance devices that can be built directly on a wide range of unusual device substrates, such as plastic or paper. In particular, transfer printing organized arrays of such wires at low temperatures onto plastic substrates yield high-quality bendable metal-semiconductor field-effect transistors; for example electrical devices are prepared on poly(ethylene terephthalate) [PET] {Y. Sun et al.; Applied Physics Letters, 87, 083501 (2005)}. This latter approach uses high quality bulk GaAs wafers as starting material, "topdown" fabrication procedures to form the micro/nanowires and transfer printing techniques that use elastomeric stamps to integrate well ordered arrays of these wires with plastic substrates. In this process, pattern of photoresist lines is defined on top of the metal stripes. The openings lie between adjacent metal stripes and openings allow the etchant to diffuse to GaAs surface to etch GaAs anisotropically. The anisotropic etching generated reverse mesas and undercuts along the surface of GaAs, resulting in the fabrication of GaAs wires released from the mother wafer.

This means, methods of patterning surfaces are well known and include photolithography techniques, as well as the soft contact printing techniques such as "micro-contact printing" as also disclosed in U.S. Pat. No. 5,512,131.

With soft-lithography techniques surface features may be produced having lateral dimensions as small as 40 nm, but the range of surface features that can be formed using these techniques is limited.

This means according to the current state of the art, any desired structures can be etched selectively in a polymer based substrates, directly by laser-supported etching methods or, after masking by wet-chemical methods or by dry-etching methods.

In another approach pastes are used to form a variety of surface features having complex architecture. Typically, pastes are applied to surfaces by screen printing, spraying, ink-jet printing, or syringe deposition. However, the lateral dimensions of surface features produced by these methods are also limited. Especially, it has been found difficult to achieve lateral dimensions below 100 µm. Especially, if the surface, which has to be patterned or structured, is composed of different materials and is not even, it is difficult to pattern selectively the polymer material uniformly and homogeneously.

The wet-chemical and dry etching methods include material-intensive, time-consuming and expensive process steps:
A. Masking of the areas not to be etched, for example by photolithography: production of a negative or positive of the etch structure
   (depending on the resist), drying of the photo-resist, exposure of the coated
   substrate surface, development, rinsing, if desired drying
B. Etching of the structures by:
dipping methods (for example wet etching in wet-chemical banks): dipping of
   the substrates into the etch bath, etching process, repeated rinsing in $H_2O$
   cascade basins, drying
spin-on or spray methods: the etching solution is applied to a rotating substrate, the etching operation can take place without/with input of energy
   (for example IR or UV irradiation), and this is followed by rinsing and drying
dry-etching methods, such as, for example, plasma etching in expensive
   vacuum units or etching with reactive gases in flow reactors As already mentioned above, the disadvantages of these etching methods described are due to the time-consuming, material-intensive, expensive process steps which are in some cases complex from a technologically or safety point of view or are carried out batch-wise.

OBJECT AND SUMMARY OF THE INVENTION

Therefore it is an object of the present invention to provide a time saving cheap method for the etching of polymer-surfaces, which may be processes in industrial scale with high efficiency and throughput of polymer-surfaces, and which is significantly less expensive than conventional wet and dry etching methods in a liquid or a gas phase.

Furthermore, it is an object of the present application to provide an inexpensive method, for the homogeneous and uniform structuring and/or patterning of a flexible polymer matrix comprising a second material. In particular, it is an object of this application to provide a suitable method for the selective structuring of a polymer matrix comprising Ag nano-tubes, also called Ag nano wires or Ag wires.

Especially it is an object of the present application to provide a method for the etching of such polymer matrices with such Ag nano-tubes, wherein the polymer matrix comprises or consists of polyethylene terephthalate (PET), polyurethane or poly(ethylene naphthalenedicarboxylate) [PEN]. Particularly it is an object of the present application, to provide a method for the selective etching of a polymer matrix with Ag nano-tubes on PET.

In a large number of experiments a new method was found for etching selectively such polymer matrices with Ag nano-tubes (also called Ag nano wires or Ag wires; in the following only called Ag nano-tubes), which comprises the steps a) applying an alkaline etching paste onto the plastic substrate,
b) heating and
c) cleaning the substrate.

Suitable etching compositions comprise an alkaline etchant selected from the group KOH, $Ca(OH)_2$, NaOH, TMAH, ethylenediamine, TMEH, SiOH, diethanolamine, and triethanolamine.

The etching paste applied in this method comprises a solvent selected from the group 1,4-butandiol, butyrolacton, ethanol, and methanol, preferably 1,4-butandiol. Particularly suitable etching pastes comprise organic and/or inorganic filler. Thus the applied etching paste may comprise particulate fillers. These fillers may be organic and/or inorganic. Preferably these fillers are organic polymer particles.

According to the present invention the used etching paste may be applied onto the substrate in various ways. Preferably the paste is screen-printed. In a special embodiment of the invention the etching compositions are applied by rotary screen printing, or stencil-printing. A further preferred printing manner is stamp printing. Pastes with adapted properties may also be ink-jetted or dispensed. In some cases it is preferred to ink-jet or to micro-jet the pastes. But a further option is to apply the etching pastes by spray coating or by slid coating.

After or already during applying the etching composition onto the surface the substrate is heated in step b) to a temperature in the range of about 40 to 140° C., preferably to a temperature in the range of about 60-120° C. for at least several seconds up to several minutes. In a preferred embodiment the substrate is heated for at least 1 to 3 minutes to a temperature of about 70 to 90° C. More preferred the heating step lasts for about 2 minutes, whereby the temperature is at about 80° C.

After etching the treated substrate is cleaned in step c) with a solvent and dried. This means the substrate is rinsed with a solvent and dried with air or in a stream of nitrogen gas. Preferably the substrate is rinsed with DI water and dried with dry air or in a stream of nitrogen gas.

It is an embodiment of the present invention that the method disclosed herein is suitable for the etching of flexible and bendable plastic substrates, which consist of polymers. Preferably these substrates comprise polymers selected from the group polyurethane, PET and PEN. Experiments have shown, that the present method is suitable to etch very narrow lines or structures with a high resolution of at least 100 µm.

DETAILED DESCRIPTION OF THE PRESENT INVENTION

The present invention provides a method for forming features in or on special uneven, flexible substrates comprising a polymer matrix. Substrates suitable to be treated according to the present invention are not particularly limited by size or planar geometry. The method of the invention is not limited by surface roughness and is applicable to heterogeneous surface morphology (i.e., substrates having varying degrees of smoothness and roughness).

A surface feature produced by a method of the present invention can generally be classified as a conformal feature, or a subtractive feature, based upon the elevation of the surface relative to a plane of the substrate. A surface feature produced by the method of the present invention can be further classified as a penetrating surface feature, based upon whether or not the base of a surface feature penetrates below the plane of a substrate on which it is formed. As used herein, a "penetration distance" refers to the distance between the lowest point of a substrate and the height of the substrate adjacent to the surface feature. More generally, the penetration distance of a surface feature refers to its lowest point relative to the plane of the substrate. Thus, a feature is said to be "penetrating" when its lowest point is located below the plane of the substrate on which the feature is located. A non-penetrating surface feature can be said to have a penetration distance of zero.

Surface features can be further differentiated based upon their composition and utility. For example, surface features produced by a method of the present invention include structural surface features and conductive surface features. The finished products, which include these surface features may also include semi-conductive surface features, insulating surface features, and masking surface features. As used herein, a "structural feature" refers to surface feature having a composition similar or identical to the composition of the substrate on which the surface feature is located.

According to the present invention a "conductive feature" refers to a surface feature having a composition that is electrically conductive, or electrically semi-conductive. Preferably the "conductive feature" is based upon a composition that is electrically conductive. Most preferably the "conductive feature" is based upon compositions whose electrical conductivity is based on a composition comprising metal compounds.

Furthermore an "insulating feature" refers to a surface feature having a composition that is electrically insulating. A "masking feature" refers to a surface feature that has a composition, which is inert to reaction with a reagent that is reactive towards an area of the substrate adjacent to and surrounding the surface feature. Thus, a masking feature can be used to protect an area of a substrate during subsequent process steps, such as, but not limited to, etching, deposition, implantation, and surface treatment steps. In some embodiments, a masking feature is removed during or after subsequent process steps. According to the present invention primarily a method for the selective etching of surfaces comprising polymers and an electrically conductive material is provided, which doesn't necessitate any masking feature.

Feature Size and Measurement

A surface feature produced by a method of the present invention has lateral and vertical dimensions that are typically defined in units of length, such as angstroms (Å), nanometers (nm), millimeters (mm), centimeters (cm) etc.

When an area of the surface surrounding a feature thereon is planar, a lateral dimension of a surface feature can be determined by the magnitude of a vector between two points located on opposite sides of a surface feature, wherein the two points are in the plane of the substrate and wherein the vector is parallel to the plane of the substrate. In some embodiments, two points used to determine a lateral dimension of a symmetric surface feature also lie on a mirror plane of the symmetric feature. In some embodiments, a lateral dimension of an asymmetric surface feature can be determined by aligning a vector orthogonally to at least one edge of the surface feature.

A surface of a substrate is "curved" when the radius of curvature of a substrate surface is non-zero over a distance on the surface of the substrate of 100 µm or more, or over a distance on the surface of the substrate of 1 mm or more. For a curved substrate a lateral dimension is defined as the magnitude of a segment of the circumference of a circle connecting two points on opposite sides of the surface feature, wherein the circle has a radius equal to the radius of curvature of the substrate. A lateral dimension of a substrate having a curved surface having multiple or undulating curvature, or waviness, can be determined by summing the magnitude of segments from multiple circles.

In some embodiments, a surface feature produced by a method of the present invention has at least one lateral dimension of about 40 nm to about 100 µm. In some embodiments, a surface feature produced by a method of the present invention has at least one lateral dimension having a minimum size of about 40 nm, about 50 nm, about 60 nm, about 70 nm, about 80 nm, about 100 nm, about 150 nm, about 200 nm, about 250 nm, about 300 nm, about 400 nm, about 500 nm, about 600 nm, about 700 nm, about 800 nm, about 900 nm, about 1 µm, about 2 µm, about 3 µm, about 4 µm, about 5 µm, about 10 µm, about 15 µm, or about 20 µm. Depending on the printing technique in some embodiments a surface feature produced by a method of the present invention has at least a lateral dimension having a maximum size of about 100 µm, about 90 mm, about 80 mm, about 70 µm, about 60 µm, about 50 µm, about 40 µm, about 36 µm, about 30 µm, about 25 µm, about 20 µm, about 15 µm, about 10 µm, about 5 µm, about 2 µm, or about 1 µm. In some embodiments feature size can be more than 100 µm because the achieved resolution depends on printing techniques, but preferred feature sizes of the present invention are less than 100 µm and most preferred feature sizes are less than 40 µm.

In some embodiments, a feature produced by a method of the present invention has a penetration distance of about 3 Å to about 100 µm. In some embodiments, a surface feature produced by a method of the present invention has a minimum penetration distance of about 3 Å, about 5 Å, about 8 Å, about 1 nm, about 2 nm, about 5 nm, about 10 nm, about 15 nm, about 20 nm, about 30 nm, about 50 nm, about 100 nm, about 500 nm, about 1 µm, about 2 µm, about 5 µm, about 10 µm, or about 20 µm below the plane of a surface. In some embodiments, a surface feature produced by a method of the present invention has a maximum penetration distance of about 1000 µm, about 90 µm, about 80 µm, about 70 µm, about 60 µm, about 50 µm, about 40 µm, about 30 µm, about 20 µm, about 10 µm, or about 5 µm below the plane of a surface.

In some embodiments, a surface feature produced by a method of the present invention has an aspect ratio (i.e., a ration of penetration distance to a lateral dimension) of about 1 000:1 to about 1:100 000, about 100:1 to about 1:100, about 80:1 to about 1:80, about 50:1 to about 1:50, about 20:1 to about 1:20, about 15:1 to about 1:15, about 10:1 to about 1:10, about 8:1 to about 1:8, about 5:1 to about 1:5, about 2:1 to about 1:2, or about 1:1.

A lateral and/or vertical dimension of a subtractive surface feature can be determined using an analytical method that can measure surface topography such as, for example, scanning mode atomic force microscopy (AFM) or profilometry. Conformal surface features cannot typically be detected by profilometry methods. However, if the surface of a conformal feature is terminated with a functional group whose polarity differs from that of the surrounding surface areas, a lateral dimension of the surface feature can be determined using, for example, tapping mode AFM, functionalized AFM, or scanning probe microcopy.

Surface features can also be identified based upon a property such as, but not limited to, conductivity, resistivity, density, permeability, porosity, hardness, and combinations thereof using, for example, scanning probe microscopy.

In some embodiments, a surface feature can be differentiated from the surrounding surface area using, for example, scanning electron microscopy or transmission electron microscopy.

In some embodiments, a surface feature has a different composition or morphology compared to the surrounding surface area. Thus, surface analytical methods can be employed to determine both the composition of the surface feature, as well as the lateral dimension of the surface feature. Analytical methods suitable for determining the composition and lateral and vertical dimensions of a surface feature include, but are not limited to, Auger electron spectroscopy, energy dispersive x-ray spectroscopy, micro-Fourier transform infrared spectroscopy, particle induced x-ray emission, Raman spectroscopy, x-ray diffraction, x-ray fluorescence, laser ablation inductively coupled plasma mass spectrometry, Rutherford backscattering spectrometry/Hydrogen forward scattering, secondary ion mass spectrometry, time-of-flight secondary ion mass spectrometry, x-ray photoelectron spectrometry, and combinations thereof.

Paste Compositions

The term "paste" according to the present invention refers to a heterogeneous composition having a viscosity of about 1 centipoise (cP) to about $10^6$ cP. A "heterogeneous composition" refers to a composition having more than one excipient or component. As used herein, "paste" can refer to viscous liquid or a semisolid. In some embodiments the paste for use with the present invention has a tunable viscosity and/or a viscosity that can be controlled by one or more external conditions. In a preferred embodiment paste refers to a composition having thixotropic properties, which means that the viscosity changes with the effective pressure, more precisely these pastes have an advantageous, non-Newtonian flow behaviour.

In some embodiments, a paste for use with the present invention has a viscosity of about 1 cP to about $10^6$ cP. In some embodiments, a paste for use with the present invention has a minimum viscosity of about 1 cP, about 2 cP, about 5 cP, about 10 cP, about 15 cP, about 20 cP, about 25 cP, about 30 cP, about 40 cP, about 50 cP, about 60 cP, about 75 cP, about 100 cP, about 125 cP, about 150 cP, about 175 cP, about 200 cP, about 250 cP, about 300 cP, about 400 cP, about 500 cP, about 750 cP, about 1000 cP, about 1250 cP, about 1500 cP, or about 2000 cP. In some embodiments, a paste for use with the present invention has a maximum viscosity of about 15 000 cP, about 10 000 cP, about 9 500 cP, about 9 000 cP, about 8 500 cP, about 7 500 cP, about 7 000 cP, about 6 500 cP, about 6 000 cP, about 5500 cP, about 5000 cP, about 4000 cP, about 3000 cP, about 2000 cP, about 1000 cP, about 500 cP, about 250 cP, about 100 cP, or about 50 cP. Preferably the applied pastes show viscosities in a range of about 1000 cp to 15 000 cP, but in general pastes are chosen, which show optimal viscosities for the special application process.

In some embodiments, the viscosity of the used paste can be controlled. Parameters that can control viscosity of a paste include, but are not limited to, the average length, molecular weight, and/or degree of cross-linking of a polymer or copolymer; as well as the presence of a solvent and the concentration of the solvent; the presence of a thickener (i.e., a viscosity-modifying component), which may be particulate, and the concentration of said thickener, the particle size of a particulate component present in the paste; the free volume (i.e., porosity) of a compound present in the paste; the swelling of a compound present in the paste; an ionic interaction between oppositely charged and/or partially charged species present in the paste (e.g., a solvent thickener interaction); and combinations thereof. Especially preferred are thickeners, building out a three-dimensional network, which changes if pressure acts on the paste composition and which is rebuilt if the pressure decreases again.

In preferred embodiments, a paste suitable for use with the present invention comprises a solvent and a thickener agent. In some embodiments, the combination of a solvent and a thickening agent can be selected to adjust the viscosity of a paste. Not being bound by any particular theory, the viscosity of a paste is an important parameter for producing surface features having a lateral dimension of about 40 nm to about 100 µm.

The viscosity of the printable, homogeneous etching pastes having non-Newtonian flow behaviour which are described in accordance with the invention is achieved by thickeners which may be network-forming or which swell in the liquid phase and can be varied depending on the desired area of application. The printable etching pastes having non-Newtonian flow behaviour, which are described in accordance with the invention, include etching pastes whose viscosity is not independent of the shear rate, in particular etching pastes having a shear-thinning action. The network produced by thickeners collapses under shear stress. The restoration of the network can take place without time delay (non-Newtonian etching pastes having a plastic or pseudoplastic flow behaviour) or with a time delay (etching pastes having a thixotropic flow behaviour).

The printable, homogeneous pastes having non-Newtonian flow behaviour are completely homogeneous with addition of thickener. Particulate thickeners, such as, for example, particulate silicone or acrylic resins, may be used.

Thickening agents suitable for use with a paste of the present invention include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide and polypropylene oxide), agar, agarose, xanthan gums, gelatin, dendrimers, colloidal silicon dioxide, and combinations thereof. Further suitable thickening agents are thickeners comprising functionalized methacrylate units, in particular cationic methacrylate/methacrylamide, such as Borchigel® A PK functionalized vinyl units, i.e.
polyvinyl alcohols of various degree of hydrolysis, in particular Mowiol® 47-88 (partially hydrolysed, i.e. vinyl acetate and vinyl alcohol units) or Mowiol® 56-98 (fully hydrolysed) or
polyvinylpyrolidones (PVP), in particular PVP K-90 or PVP K-120

These thickeners can be employed individually or in combinations with other thickeners mentioned above.

According to the present invention, a thickener is present in the etching paste in a concentration of about 0.1% to about 15%, about 0.5% to about 15%, preferably of about 5 to about 15%, about 6.5 to about 13%, about 7 to 13%, or about 8% to about 12%, by weight of the paste.

Preferably thickening agents may be added in an amount of about 8 to 15%, more preferably of about 10 to 13% by weight of the entire composition.

In some embodiments, as the lateral dimensions of the desired surface features decreased it can be necessary to reduce the particle size or physical length of components in the paste. For example, for surface features having lateral dimension of about 100 nm or less it can be necessary to reduce or eliminate polymeric components from a paste composition.

In general, a paste comprises a solvent. Solvents suitable for use in a paste of the present invention include, but are not limited to water, $C_1$-$C_8$ alcohols (e.g., methanol, ethanol, propanol, and butanol), $C_6$-$C_{12}$ straight chain, branched and cyclic hydrocarbons (e.g., hexane and cyclohexane), $C_6$-$C_{14}$ aryl and aralkyl hydrocarbons (e.g., benzene and toluene), $C_3$-$C_{10}$ alkyl ketones (e.g., acetone), $C_3$-$C_{10}$ esters (e.g., ethyl acetate), $C_4$-$C_{10}$ alkyl ethers, and combinations thereof. Preferably a solvent selected from the group 1,4-butandiol, butyrolacton, ethanol, and methanol, or a mixture thereof, preferably 1,4-butandiol is (are) added to prepare the pastes. Additionally to these solvents or as the sole solvent the pastes may comprise a certain amount water. Usually the pastes comprise water if KOH or NaOH are the effective etchant. In general in advance to the preparation of the pastes KOH, NaOH or Ca(OH)$_2$ is solved in pure water, especially DI water. In some embodiments, a solvent is present in a paste in a concentration of about 20% to about 65% by weight. In some embodiments, a solvent is present in a paste in a maximum concentration of about 65%, about 64%, about 63%, about 61%, about 55%, about 50%, about 40%, about 30%, about 25%, or about 20% by weight of the paste. In some embodiments, a solvent is present in a minimum concentration of about 20%, about 22%, about 25%, about 30%, about 40%, about 50%, about 60%, or about 65% by weight of the paste. Thus etching compositions may comprise KOH, Ca(OH)$_2$, NaOH, TMAH, ethylenediamine, TMEH, SiOH, diethanolamine, and triethanolamine as etchant, which are solved in water or mixtures of water and further solvents.

In some embodiments of the present invention the used paste further comprises additives having properties which are advantageous for the desired purpose. Additives like this are antifoams, such as, for example, the one available under the trade name TECO® Foamex N, thixotropic agents, such as BYK® 410, Borchigel® Thixo2, flow-control agents, such as TECO® Glide ZG 400, deaeration agents, such as TECO® Airex 985, and adhesion promoters, such as Bayowet® FT 929.

These additives may have a positive effect on the printability of the printing paste, but also on the etching depth and result.

In some embodiments, a paste further comprises a surfactant. A surfactant present in a paste can modify the surface energy of a stamp and/or substrate to which the paste is applied, thereby improving the wetting of a surface by the paste. Surfactants suitable for use with the present invention include, but are not limited to fluorocarbon surfactants that include an aliphatic fluorocarbon group (e.g., ZONYL®FSA and FSN fluorosurfactants, E.I. Du Pont de Nemours and Co., Wilmington, Del.), fluorinated alkyl alkoxylates (e.g., FUORAD® surfactants, Minnesota Mining and Manufacturing Co., St. Paul, Minn.), hydrocarbon surfactants that have an aliphatic group (e.g., alkylphenol ethoxylates comprising an alkylgroup having about 6 to about 12 carbon atoms, such as octylphenol, ethoxylate, available as TRITON® X-100, Union Carbide, Danbury, Conn.), silicone surfactants such as silanes and siloxanes (e.g., polyoxyethylene-modified polydimethylsiloxanes such as DOW CORNING® Q2-5211 and Q2-5212, Dow Corning Corp., Midland, Mich.), fluorinated silicone surfactants (e.g., fluorinated polysilanes such as LEVELENE® 100, Ecology Chemical Co., Watertown Mass.); and combinations thereof.

According to the embodiments of the present invention, a suitable paste further comprises necessarily an etchant. As used herein, an "etchant" refers to a component that can react with a substrate to remove a portion of the substrate. Thus an etchant is used to form a subtractive feature, and in reacting with a substrate, forms at least one of a volatile material that can diffuse away from the substrate, or a residue, particulate, or fragment that can be removed from the substrate by, for example, a rinsing or cleaning process. In general according to the present invention, suitable etchants are as mentioned before KOH, NaOH or $Ca(OH)_2$, but KOH is preferred as an etchant and it is present in a paste according to the present invention in a concentration of about 15% to about 35%, about 17% to about 30%, or about 20% to about 30% by weight of the paste. Said etchants may be combined with further basic etchants as mentioned in the following.

The composition and/or morphology of a substrate that reacts with an etchant is preferably a polymeric surface, comprising a conductive material. Subtractive features formed by reaction of an etchant with the substrate are also not particularly limited so long as the material that reacts with the etchant can be removed from the resulting subtractive surface feature. Not being bound by any particular theory, an etchant can remove material from such a surface by reacting with the substrate to form a volatile product, a residue, a particulate, or a fragment that can, for example, be removed from the substrate by rinsing or a cleaning process. For example, an etchant can react with a polymer building the surface by forming soluble or volatile species. In some embodiments, an etchant can react with a substrate to form an ionic species that is water soluble. Processes suitable for removing a residue or particulate formed by reaction of an etchant with a surface are for example disclosed in U.S. Pat. No. 5,894,853, which is incorporated herein by reference in its entirety.

Etchants suitable for use with the present invention include basic etchants as mentioned above. Basic etchants suitable for use with the present invention include preferably potassium hydroxide, which may be combined with etchants like sodium hydroxide, calcium hydroxide, ammonium hydroxide, tetraalkylammonium hydroxide ammonia, ethanolamine, ethylenediamine, and combinations thereof, but the most preferred etchant is potassium hydroxide as such. It was found, that flexible polymer surfaces comprising or consisting of polymer matrices with Ag nano-tubes (here and in the following the expression "Ag nano-tubes" is used meaning also "Ag wires" and Ag nano-wires" of 1-D structures with diameters between 1 and 100 nm with lengths up to several hundreds of nanometers), wherein the polymer matrix comprises or consists of polyethylene terephthalate (PET), polyurethane or poly(ethylene naphthalenedicarboxylate) [PEN] may be etched selectively with high resolution, if etching pastes comprising KOH in concentrations in the range of about 15 to 35%, preferably in a range of 20 to 30% by weight of the entire composition are applied.

In a preferred embodiment, the flexible polymer surface comprises a conductive component. As used herein, a "conductive component" refers to a compound or species that can transfer or move electrical charge. Conductive components suitable for use with the present invention include, but are not limited to, a metal, a nano-particle, a polymer, and combinations thereof. In some embodiments, a conductive component is present in the polymer surface in a concentration of about 1% to about 90% by weight.

Metals suitable for use with the present invention include, but are not limited to a transition metal, aluminum, silicon, phosphorous, gallium, germanium, indium, tin, antimony, lead, bismuth, alloys thereof, and combinations thereof. In a most preferred embodiment of the present invention, the polymer surfaces comprise silver, which is present in form of nano-particles (i.e., a particle having a diameter of 100 nm or less, or about 0.5 nm to about 100 nm). Nano-particles suitable for use with the present invention can be homogeneous, multilayered, functionalized, and combinations thereof. Preferably they are formed like nano-tubes.

The method of the present invention is particularly suitable for the etching of flexible and bendable plastic substrates, which consist of polymers, especially for polymers selected from the group polyurethane, PET and PEN. Correspondingly experiments have shown that the present method is suitable to etch very narrow lines or structures with a high resolution of at least 100 μm.

A paste used in the present invention may comprise a conductive component and a reactive component. For example, a reactive component present in the paste can promote at least the reaction between the etchant and a substrate, the adhesion between the paste and the substrate to be etched, and combinations thereof. Surface features formed by reaction of this paste composition include subtractive penetrating, and conformal penetrating subtractive penetrating, and conformal penetrating surface features.

The present invention includes the use of a paste containing an etchant, that can be applied to produce a subtractive surface feature having a conductive feature inset therein.

Substrates

Substrates suitable for patterning by the method of the present invention include materials having a surface capable of being contacted with a stamp or screen. Substrates suitable for patterning by the method of the present invention include films, thin films, laminates, foils, plastics, polymers, and combinations thereof. In some embodiments, a substrate is selected from a porous variant of any of the above materials.

A substrate to be patterned by a method of the present invention comprises a flexible substrate, such as a plastic, a composite, a laminate, a thin film, a metal foil, and combinations thereof. In some embodiments, the flexible material can be patterned by the method of the present invention on a reel-to-reel manner. Preferably, the etching paste is transferred to the substrate surface to be etched in a printing technology. In particular, screen printing, silk-screen printing, pad printing, stamp printing and ink-jet printing methods are printing methods which are known to the person skilled in the art. Manual application is likewise possible.

The present invention contemplates optimizing the performance, efficiency, cost, and speed of the process steps by selecting a suitable paste for a special substrate, i.e. polyethylene teraphthalate (PET), which usually is a low weight polymer and which shows high rupture safety.

The etching may take place at the temperature of the environment, like room temperature. But the etching reaction may also be activated by input of energy, for example by convection and by thermal radiation by IR emitters, UV or laser radiation, with the result that the temperature is raised up to about 300° C. at the place of reaction directly on the surface. If applicable, the reaction of the paste on the substrate is initiated by at least one type of radiation, for example, by ultraviolet light that can be used with a paste whose reaction may be initiated by ultraviolet light, and which permits the reaction of a paste on the front-surface of a substrate to be initiated by illuminating a backside of the substrate with ultraviolet light. Preferably the reaction is initiated with IR waves and raising the surface temperature. Preferably the etching takes place at a temperature at temperatures up to 180° C., most preferred under moderate conditions at temperatures up to 100° C. This means, as such the etching may take place in a wide range of temperature between about 20 up to 300°, but depending on the chemical nature of the surface to be etched, the etching temperature is adjusted in the range of room temperature up to 180° C. But if good etching results may be achieved the temperature may also be adjusted at moderate temperatures up to 100° C. In general, the etching of polymer surfaces takes place at lower temperatures and the etching of inorganic surfaces may take place at higher temperatures up to 300° C.

Stamps, Stencils or Screens

As used herein, a "stamp" refers to a three-dimensional object having on at least one surface of the stamp an indentation that defines a pattern. Stamps for use with the present invention are not particularly limited by geometry, and can be flat, curved, smooth, rough, wavy, and combinations thereof. In some embodiments, a stamp can have a three dimensional shape suitable for conformally contacting a substrate. In some embodiments, a stamp can comprise multiple patterned surfaces that comprise the same or different patterns. In some embodiments, a stamp comprises a cylinder wherein one or more indentations in the curved face of the cylinder define a pattern. As the cylindrical stamp is rolled across a surface, the pattern is repeated. Paste or ink can be applied to a cylindrical stamp as it rotates. For stamps having multiple patterned surfaces: cleaning, applying, contacting, removing, and reacting steps can occur simultaneously applying different surfaces of the same stamp.

Stamps for use according to the present invention are not particularly limited by materials, and can be prepared from materials such as, but not limited to, glass (e.g., quartz, sapphire, borosilicate glass), ceramics (e.g., metal carbides, metal nitrides, metal oxides), plastics, metals, and combinations thereof. In some embodiments, a stamp for use with the present invention comprises an elastomeric polymer.

As used herein, an "elastomeric stamp" refers to a molded three-dimensional object comprising an elastomeric polymer, and having on at least one surface of the stamp an indentation that defines a pattern. More generally, stamps comprising an elastomeric polymer are referred to as elastomeric stamps. As used herein, an "elastomeric stencil" refers to a moulded three dimensional object comprising an elastomeric polymer, and having at least one opening that penetrates through two opposite surfaces of the stencil to form an opening in die surface of the three dimensional object. An elastomeric stamp or stencil can further comprise a stiff flexible, porous, or woven backing material, or any other means of preventing deformation of the stamp or stencil when it is used during processes described herein. Similar to stamps, elastomeric stencils for use with the present invention are not particularly limited by geometry, and can be flat, curved, smooth, rough, wavy, and combinations thereof.

Elastomeric polymers suitable for use with the present invention include, but are not limited to, polydimethylsiloxane, polysilsesquioxane, polyisoprene, polybutadiene, polychloroprene, teflon, and combinations thereof. Other suitable materials and methods to prepare elastomeric stamps suitable for use with the present invention are disclosed in U.S. Pat. Nos. 5,512,131; 5,900,160; 6,180,239; and 6,776,094; and pending U.S. application Ser. No. 10/766,427, all of which are incorporated herein by reference in their entirety.

Pastes can be applied to a surface of a stamp or a surface of a substrate by methods known in the art such as, but not limited to, screen printing, ink jet printing, syringe deposition, spraying, spin coating, brushing, and combinations thereof, and other application methods known to persons of ordinary skill in the art of coating surfaces. In some embodiments, a paste is poured onto a surface of a stamp, and then a blade is moved transversely across the surface to ensure that die indentations in the stamp are completely and uniformly filled with the paste. The blade can also remove excess paste from the surface of a stamp. Applying a paste to a substrate or the surface of the stamp can comprise rotating the surface at about 100 revolutions per minute (rpm) to about 5,000 rpm, or about 1,000 rpm to about 3,000 rpm, while pouring or spraying the paste onto the rotating surface.

Preferably, a paste is applied to a stamp to completely and uniformly fill the at least one indentation in the surface of the stamp. Not being bound by any particular theory, as the lateral dimensions of the indentation in the stamp become smaller, the viscosity of the paste should be decreased to ensure that the pattern in the stamp is filled uniformly during the applying step. Non-uniform application of a paste to a stamp can result in a failure to correctly and reproducibly produce surface features having the desired lateral dimensions.

Further suitable embodiments of printing are screen-printing, rotary screen printing, slid and dispense printing or spray coating, but also jet printing, if the viscosity of the composition is adapted appropriately.

In some embodiments as disclosed above, the composition of a paste can be formulated to control its viscosity such that it can be applied by screen printing. Parameters that can control paste viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swelling of a component, ionic interactions between paste components (e.g., solvent-thickener interactions), and combinations thereof.

In some embodiments, the viscosity of a paste is modified during one or more of an applying step, contacting step, reacting step, or combinations thereof. For example, the viscosity of a paste can be decreased while applying the paste to a surface of a stamp to ensure that indentations in the surface of a stamp are filled completely and uniformly. After contacting the coated stamp with a substrate, the viscosity of the paste can be increased to ensure that the lateral dimensions of the indentations in the stamp are transferred to the lateral dimensions of a surface feature formed on the substrate.

Not being bound by any particular theory, the viscosity of a paste can be controlled by an external stimulus such as temperature, pressure, pH, the presence or absence of a reactive species, electrical current, a magnetic field, and combinations thereof. For example, increasing the temperature of a paste will typically decrease its viscosity; and increasing the pressure applied to a paste will typically increase its viscosity, with the exception to pastes having thixotropic properties.

The pH of a paste either increases or decreases the viscosity of a paste depending on the properties of one or more components in the paste, depending on the overall solubility of the component mixture as a function of pH. For example, an aqueous paste containing a weakly acidic polymer will typically have a decreased viscosity below the $pK_a$ of the polymer because the solubility of the polymer will increase below its $pK_a$. However, if protonation of the polymer leads to an ionic interaction between die polymer and another component in the paste that decreases the solubility of the polymer, then the viscosity of the paste will likely increase. Careful selection of paste components permits paste viscosity to be controlled over a wide range of pH values.

Transfer of the paste from a surface of a stamp or a another printing device to a substrate can be promoted by one or more interactions between the paste and the surface of the stamp or the printing device, between the paste and the substrate, between the surface of the stamp or printing device and the substrate, and combinations thereof that promote(s) adhesion of a paste to an area of a substrate. Not being bound by any particular theory, adhesion of a paste to a substrate can be promoted by gravity, a Van-der-Waals interaction, a covalent bond, an ionic interaction, a hydrogen bond, a hydrophilic interaction, a hydrophobic interaction, a magnetic interaction, and combinations thereof. Consequently, the etching paste is preferably composed such that these interactions between a paste and the surface of a stamp or the printing device are minimized and the transfer of the paste from the surface of the stamp or of the printing device to the substrate is facilitated.

In some embodiments, contacting a stamp or elastomeric stencil or printing screen with a surface of a material can be facilitated by the application of pressure or vacuum to the backside of either or both the stamp, stencil and surface. In some embodiments, the application of pressure or vacuum can ensure that a paste is substantially removed from between the surfaces of the stamp or stencil and material. In some embodiments, the application of pressure or vacuum can ensure that there is conformal contact between the surfaces. In some embodiments, the application of pressure or vacuum can minimize the presence of gas bubbles present between the surfaces of the stamp and the substrate, or gas bubbles present in an indentation in the surface of the stamp, or gas bubbles present in the paste prior to reacting the paste. Not being bound by any particular theory, the removal of gas bubbles can facilitate in the reproducible formation of surface features having lateral dimensions of 100 µm or less.

In some embodiments, the surface of a substrate and/or the surface of a printing device like stamp can be selectively patterned, functionalized, derivatized, textured, or otherwise pre-treated. As used herein, "pre-treating" refers to chemically or physically modifying a surface prior to applying or reacting a paste. Pre-treating can include, but is not limited to, cleaning, oxidizing, reducing, derivatizing, functionalizing, exposing to a reactive gas, exposing to a plasma, exposing to a thermal energy (e.g., convective thermal energy, radiant thermal energy, conductive thermal energy, and combinations thereof), exposing to an electromagnetic radiation (e.g., x-rays, ultraviolet light, visible light, infrared light, and combinations thereof), and combinations thereof. Not being bound by any particular theory, pre-treating a surface of a stamp and/or a substrate can increase or decrease an adhesive interaction between a paste and a surface, and facilitate the formation of surface features having a lateral dimension of about 100 µm or less.

For example, derivatizing a surface of a stamp and/or substrate with a polar functional group (e.g., oxidizing the surface) can promote the wetting of a surface by a hydrophilic paste and deter surface wetting by a hydrophobic paste. Moreover, hydrophobic and/or hydrophilic interactions can be used to prevent a paste from penetrating into the body of a stamp. For example, derivatizing the surface of a stamp with a fluorocarbon functional group can facilitate the transfer of a paste from the stamp to the surface of a material.

The method of the present invention produces surface features by reacting a paste with an area of a substrate. As used herein, "reacting" refers to initiating a chemical reaction comprising at least one of: reacting one or more components present in the paste with each other, reacting one or more components of a paste with a surface of a substrate, reacting one or more components of a paste with sub-surface region of a substrate, and combinations thereof.

According to the invention, reacting comprises applying a paste to a substrate. This means for example, that a reaction is initiated upon contact between a paste and a surface of a substrate.

Therefore, reaction of the paste comprises a chemical reaction between the paste and a functional group on the substrate, or a chemical reaction between the paste and a functional group below the surface of the substrate. Thus, methods of the present invention comprise reacting a paste or a component of a paste not only with a surface of a substrate, but also with a region of a substrate below its surface, thereby forming inset or inlaid features in a substrate. Not being bound by any particular theory, a component of a paste can react with a substrate by reacting on the surface of the substrate, or penetrating and/or diffusing into the substrate. In some embodiments, the penetration of a paste into the surface of a substrate can be facilitated by the application of physical pressure or vacuum to the backside of a stamp, stencil, substrate, or combinations thereof.

Reaction between a paste and a substrate can modify one or more properties of substrate, wherein the change in properties is localized to the portion of the substrate that reacts with the paste.

Preferably, reacting the paste with a substrate comprises reactions that propagate into the plane (i.e., body) of a substrate, as well as reactions in the lateral plane of a surface of the substrate. For example, a reaction between an etchant and a substrate comprises the etchant penetrating into the surface of the substrate (i.e., penetration orthogonal to the surface), such that the lateral dimensions of the lowest point of the surface feature are approximately equal to the dimensions of the feature at the surface of the substrate.

In some embodiments, etching reactions also occur laterally between a paste and a substrate, such that the lateral dimensions at the bottom of a surface feature are more narrow than the lateral dimensions of the feature at the plane of the surface. As used herein, "undercut" refers to situations when the lateral dimensions of a surface feature are greater than the lateral dimensions of a stamp used to apply a paste to form the surface feature. Typically, undercut is caused by reaction of an etchant or reactive species with a surface in a lateral dimension, and can lead to the formation of beveled edges on subtractive features.

The paste compositions for use with the present invention are formulated to minimize the reaction of the paste in a lateral dimension of a surface (i.e., to minimize undercut). Not being bound by any particular theory, undercut can preferably be minimized by employing a light-activated paste (i.e., a paste that reacts with a surface upon exposure to radiation). Illumination of the paste through the backside of the transparent surface initiates a reaction between the paste and the surface. Because the light illuminates only the surface of the paste reacting vertically with the surface, paste along the sidewalls of a subtractive surface feature is not exposed to ultraviolet light, thereby minimizing lateral etching of the surface. This technique is generally applicable to any reaction initiator that can be directed at the surface. In some embodiments, the reaction initiator can activate a paste through the backside of a stamp or elastomeric stencil.

Undercut can also be minimized by the use of a substrate having an anisotropic composition or structure, such that etching in the vertical direction is preferred compared to etching in a lateral dimension. Some materials are naturally anisotropic, while anisotropy can also be introduced by, for example, pre-treating a substrate with a chemical or radiation, and combinations thereof.

Reacting the paste may comprise removing solvent from the paste. Not being bound by any particular theory, the removal of solvent from a paste can solidify the paste, or catalyze cross-linking reactions between components of a paste. For pastes containing solvents with a low boiling point (e.g., b.p.<60° C.), the solvent can be removed without heating of a surface. Solvent removal can also be achieved by heating the surface, paste, or combinations thereof.

In some embodiments, reacting comprises exposing a paste to a reaction initiator. Reaction initiators suitable for use with the present invention include, but are not limited to, thermal energy, electromagnetic radiation, acoustic waves, an acid or a base (e.g., a decrease or increase in pH), an increase or decrease in pressure, an alternating or direct electrical current, agitation, sonication, and combinations thereof. In some embodiments, reacting comprises exposing a paste to multiple reaction initiators.

Electromagnetic radiation suitable for use as a reaction initiator can include, but is not limited to, microwave light, infrared light, visible light, ultraviolet light, x-rays, radiofrequency, and combinations thereof.

In some embodiments, a stamp or elastomeric stencil is removed from a substrate before reaction of the paste. In some embodiments, a stamp or elastomeric stencil is removed from a substrate after reacting the paste.

In some embodiments, prior to applying the etching paste to a substrate, the substrate is patterned using a micro-contact printing method. For example, an ink can be applied to an elastomeric stamp having at least one indentation in the surface of the elastomeric stamp which defines a pattern, to form a coated elastomeric stamp, and the coated stamp is contacted with a substrate. The ink is transferred from the surface of the coated elastomeric stamp to the substrate in a pattern on the substrate defined by the pattern in the surface of the elastomeric stamp. The ink adheres to the surface, and can form at least one of a thin film, a monolayer, a bilayer, a self-assembled monolayer, and combinations thereof. In some embodiments the ink can react with the substrate. A paste is then applied to the substrate, wherein the paste is reactive towards either one of the exposed areas of the substrate or the areas of the substrate covered by the ink pattern, screen printing, ink jet printing, syringe deposition, spraying, spin coating, brushing, and combinations thereof, and other application methods known to persons of ordinary skill in the art of coating surfaces. After reaction the paste, any residual paste and/or ink and reaction products on the substrate can be removed. The resulting patterned substrate comprises a pattern having lateral dimensions that are determined by the pattern in the surface of the elastomeric stamp used to apply the ink to the substrate, as well as any patterns transferred to the substrate during the paste deposition process.

Other Preferred Printing Devices

In preferred embodiments of the present invention the etching paste is applied by screen printing, silk-screen printing, pad printing, or jet printing methods which are printing methods known to the person skilled in the art. Manual application is likewise possible.

Depending on the design of the screen, silk screen, clischee or stamp or the cartridge addressing, it is possible to apply the printable, homogeneous, etching pastes having non-Newtonian flow behaviour which are described in accordance with the invention over the entire area or selectively in accordance with the etch structure mask only to the points at which etching is desired. All masking and lithography steps, which were needed earlier are unnecessary. As already described above, the etching operation can take place with or without input of energy, for example in the form of heat radiation (using IR emitters). After etching is complete, the printable etching pastes having non-Newtonian flow behaviour and reaction products are rinsed off the etched surface using a suitable solvent, preferably DI water.

By variation of the following parameters, the etch depth in the treated surface layers of variable thickness, and in the case of selective structure etching, in addition the edge sharpness of the etch structures can be adjusted;

concentration and composition of the etching components
concentration and composition of the solvents employed
concentration and composition of the thickener systems
concentration and composition of any additives added, such as antifoams, thixotropic agents, flow-control agents, deaeration agents and adhesion promoters
viscosity of the printable, homogeneous etching pastes having non-Newtonian flow behaviour which are described in accordance with the invention
etching duration with or without input of energy into the polymer surfaces printed with the respective printing paste and their layers, and
input of energy into the system printed with the etching paste.

All interactions between used etching pastes and surfaces to be etched described above are also active when the pastes are applied by use of devices and methods other than flexible stencils or stamps.

Method of the Present Invention

As described above, the objective of the present invention is therefore to provide an etching medium which can be employed in said technologically simple etching method with high potential throughputs for polymer-surfaces. This simple etching method is significantly less expensive than conventional wet and dry etching methods in the liquid or gas phase.

This method is found to be very selective towards polymer matrices in the etching treatment of such surfaces and alignments in high sophisticated circuits prepared on suitable flexible polymer surfaces.

A most suitable polymer is PET, which is a polyethylene terephthalate polymer, usually a low weight polymer, showing high rupture safety. Another suitable polymer is PEN, which is a polymer of 2,6-naphthalenedicarboxylic acid dimethyl ester with 1,2-ethanediol and which is also known as poly(ethylene naphthalenedicarboxylate). This polymer is commercially available under the trade names "PEN Polymer 18348" or "Developmental PEN 10533 Polyester".

In case that surfaces made of one of these polymers have to be etched according to the method of the present invention, the etching paste is printed onto the plastic substrate, heated to a temperature of about 80° C. for at least 90 s and then washed with DI water. Thus the polymer matrix is etched by a paste containing a solvent, potassium hydroxide (KOH), thickener and organic filler content. The method and the paste according to the present invention are particularly useful for screen-printing and selectively etching small structures on plastic substrates, wherein an etching composition may be applied to an elastomeric stamp having at least one indentation in the surface of the elastomeric stamp which defines a pattern, to form elastomeric stamp coated with etching paste, and the coated stamp is contacted with a substrate.

The etching paste compositions may be applied in a single process step onto the substrate surface to be etched.

Thus, the method according to the present invention may be processed with a high degree of automation and high throughput, which is suitable for transfer of the etching paste to the substrate surface to be etched, if it uses a special printing technology. In particular, screen printing, silk-screen printing, pad printing, stamp printing, micro-jet-printing and ink-jet printing methods are printing methods which are known to the person skilled in the art and which are preferred. Manual application is likewise possible. But most preferred is a micro-contact printing method.

The etched depth in the polymer based substrate surfaces, and their layers of variable thickness, and in case of selective structure etching, in addition the edge sharpness of the etch structures especially can be adjusted by variation of the following parameters:

- Concentration and composition of the etching components
- Concentration and composition of the solvents
- Concentration and composition of the thickener systems
- Concentration and composition of the filler content
- Concentration and composition of any additives added, such as antifoams, thixotropic agents, flow-control agents, de-aeration agents and adhesion promoters
- Viscosity of the printable KOH based etching paste as described in accordance with the invention
- Etching duration with or without input of energy into the etching paste and/or the to be etched substrate The etching duration can last a few seconds but also for several minutes depending on the application, desired etching depth and/or edge sharpness of the etch structures. In general the etching duration is set to a period of time in the range of about 30 s to about 20 minutes. Preferably the etching time is in the range of about 1 min to about 15 min, more preferably in the range of about 3 min to about 12 min.

According to a preferred embodiment of the present invention the used etching composition is a printable KOH based etching paste, consisting of an etchant, solvent, thickener and a certain amount of filler, which are mixed to form the paste. The used etching composition may comprise KOH in a range of about 15 to 35%, preferably in a range of 20 to 30% by weight of the entire composition. Etching compositions according to the present invention may comprise solvents in a range of about 20 to 65%, preferably in a range of 25 to 55% by weight of the entire composition. Thickening agents may be added in an amount of about 8 to 15%, preferably of about 10 to 13% by weight of the entire composition. Organic and/or inorganic fillers may be incorporated in an amount of about 5 to 20%, preferably in an amount of about 8 to 15%, and most preferably of about 10 to 13% by weight of the entire composition. In addition to these components the etching composition may comprise further additives like surfactants, wetting agents and the like as described above. Suitable additives are mentioned above. These additives may be added in an amount in the range of about 0.01 to 1%, preferably of about 0.1 to 0.5% by weight of the entire composition.

The mixing may be carried out in a suitable vessel, which is equipped with an appropriate stirrer. Preferably the mixing is carried out in a beaker with a magnetic stirrer. Thus the amount of KOH is mixed with the solvent. The thickener is slowly added while stirring the mixture. Afterwards a suitable amount of a filler, preferably a particulate filler, is added while stirring the mixture. The mixing may be carried out at room temperature of about 20 to 30° C. In order to improve the solubility of ingredients and to shorten the time necessary for mixing, the temperature may be elevated below the boiling point of the added solvent, preferably not above 70° C. Most preferably the mixing is carried out at temperatures in the range of about 25-60° C., especially in the range of 30-50° C. The prepared etching paste is storage stable at common storage temperatures.

As described before the printable, homogeneous etching pastes having non-Newtonian behaviour according to the invention can be employed, in particular, in all cases where full-area and/or structured etching of surfaces of polymer surfaces or systems comprising such layers especially made of polymers like polyurethane, PEN or PET is desired.

Thus, entire surfaces, but also individual structures can be etched selectively down to the desired depth into uniform, solid, nonporous and porous polymers as mentioned above, i.e. the etching operation can cover all ranges between micro-structuring to etching of deep etch structures, especially in such polymer materials comprising conductive materials like metal particles or Ag nano-tubes.

In particular, screen printing, silk-screen printing, pad printing, stamp printing and ink-jet printing methods are suitable techniques for applying the etching pastes as desired. In general, besides the said printing methods, manual application (for example brush) is also possible.

The printable, homogeneous, etching pastes having non-Newtonian flow behaviour which are described in accordance with the invention can be employed in all cases where layers of polymers, as mentioned above, of variable thickness are to be etched over the entire area and/or in a structured manner.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Overall, the method according to the present invention for etching flexible, polymer substrates with pastes as disclosed thus enables large numbers of pieces to be etched inexpensively in a suitable automated process on an industrial scale.

Even without any further explanations, it is assumed that a person skilled in the art can make use of the above description in its widest scope. The preferred embodiments and examples are therefore to be regarded merely as descriptive but in no way limiting disclosures.

For better understanding and for illustration, examples are given below which are within the scope of protection of the present invention. These examples also serve for the illustration of possible variants.

The complete disclosure of all applications, patents and publications mentioned above and below are incorporated by reference in the present application and shall serve in cases of doubt for clarification.

It goes without saying that, both in the examples given and also in the remainder of the description, the quoted percentage data of the components present in the compositions always add up to a total of 100% and not more. All percentage data of the components present in the compositions are % w/w or percent by weight. Given temperatures are measured in ° C.

EXAMPLES

Example 1

50 g KOH (47%)
20 g butyrolacton
10 g Carbopol EZ 2
10 g Vestosint PA 2070

KOH solution is mixed with butyrolacton. Subsequently 10 g Carbopol EZ 2 and 10 g Vestosint PA 2070 are added with stirring. The mixture is stirred or a further 2 hours.

Example 2

30 g KOH (47%)
20 g ethanol 10 g Carbopol EZ 2
10 g Vestosint PA 2070

The paste is prepared in the same manner as described in example 1.

Example 3

60 g KOH (47%)
20 g methanol
10 g Carbopol EZ 2
10 g Vestosint PA 2070

The paste is prepared in the same manner as described in example 1.

The etching paste is printed on the substrate by a screen-printer. But it is possible to use other methods of printing the etching paste as described above.

For good results the concentration of the etchant, the applied amount of etching paste, the etching time and the temperature during etching have to be optimized for different layers and layer-thicknesses.

The invention claimed is:

1. A method comprising selectively etching a polymer matrix with Ag nanotubes, by:
   a) applying an alkaline etching paste onto a surface of the polymer matrix comprising Ag nanotubes,
   b) heating the polymer matrix, and
   c) cleaning the polymer matrix.

2. The method according to claim 1, wherein the applied etching paste comprises an alkaline etchant selected from the group consisting of KOH, Ca(OH)$_2$, NaOH, TMAH, ethylenediamine, TMEH, SiOH, diethanolamine, and triethanolamine.

3. The method according to claim 1, wherein the applied etching paste comprises a solvent selected from the group consisting of 1,4-butandiol, butyrolacton, ethanol, and methanol.

4. The method according to claim 1, wherein the applied etching paste comprises 1,4-butandiol as a solvent.

5. The method according to claim 1 wherein the applied etching paste comprises organic and/or inorganic filler.

6. The method according to claim 1, wherein the applied etching paste comprises organic polymer particles as a particulate filler.

7. The method according to claim 1, wherein the applied etching paste is stamp printed onto the substrate.

8. The method according to claim 1, wherein the etching paste is applied onto the substrate by screen printing.

9. The method according to claim 1, wherein the etching paste is applied onto the substrate by ink-jetting.

10. The method according to claim 1, wherein the etching paste is dispensed onto the substrate.

11. The method according to claim 1, wherein the etching paste is applied onto the substrate by spray coating or by slid coating.

12. The method according to claim 1, wherein in step b) the substrate is heated to a temperature in the range of about 40 to 140° C.

13. The method according to claim 1, wherein in step b) the substrate is heated for 2 min at 80° C.

14. The method according to claim 1, wherein in step b) after etching the substrate is rinsed with a solvent and dried with dry air or in a stream of nitrogen gas.

15. The method according to claim 1 wherein in step b) after etching the substrate is rinsed with DI water; and dried with dry air or in a stream of nitrogen gas.

16. The method according to claim 1, wherein said polymer matrix is made of polyurethane or of PEN [poly(ethylene naphthalenedicarboxylate)] or of PET (polyethylene terephthalate).

17. The method according to claim 1, wherein lines and structures are etched with a resolution of at least 100 μm.

18. The method according to claim 8, wherein the etching paste is applied onto the substrate by rotary screen printing, or stencil-printing.

19. The method according to claim 9, wherein the etching paste is applied onto the substrate by micro-jetting.

20. The method according to claim 12, wherein in step b), the substrate is heated to a temperature in the range of about 80-120° C.

* * * * *